US005545923A

United States Patent [19]
Barber

[11] Patent Number: 5,545,923
[45] Date of Patent: Aug. 13, 1996

[54] SEMICONDUCTOR DEVICE ASSEMBLY WITH MINIMIZED BOND FINGER CONNECTIONS

[75] Inventor: Ivor Barber, San Jose, Calif.

[73] Assignee: LSI Logic Corporation, Milpitas, Calif.

[21] Appl. No.: 396,084

[22] Filed: Feb. 28, 1995

Related U.S. Application Data

[63] Continuation of Ser. No. 142,251, Oct. 22, 1993, abandoned.

[51] Int. Cl.$^6$ .............................. H01L 23/52; H01L 23/04
[52] U.S. Cl. ............................................. 257/691; 257/698
[58] Field of Search ...................................... 257/691, 698

[56] References Cited

U.S. PATENT DOCUMENTS

| | | | |
|---|---|---|---|
| 4,513,355 | 4/1985 | Schroeder et al. | 257/698 |
| 5,105,257 | 4/1992 | Michii | 257/691 |

FOREIGN PATENT DOCUMENTS

| | | | |
|---|---|---|---|
| 2186670 | 7/1990 | Japan | 257/691 |
| 4109637 | 4/1992 | Japan | 257/691 |

Primary Examiner—Sara W. Crane
Assistant Examiner—Valencia Martin Wallace
Attorney, Agent, or Firm—Katz & Cotton, LLP

[57] ABSTRACT

A semiconductor device assembly having external connections, including power supply connections such as to a power source or ground, is made without resort to bond fingers. Rather, external connections are directly made from a semiconductor die to a conductive layer. The conductive layer is disposed on one surface of a printed wring board and is divided into electrically insulated conductive segments. Each of the conductive segments is connected to an external connection, and includes one or more interconnects that can be directly connected to a semiconductor die. The conductive segments are surrounded by an array of bond fingers which serve to connect the semiconductor die to further external connections, such as signal connections. The present invention is especially advantageous in the fabrication of pin grid array (PGA) and ball grid array (BGA) type integrated circuit packages.

15 Claims, 7 Drawing Sheets

SEMICONDUCTOR DEVICE ASSEMBLY WITH MINIMIZED BOND FINGER CONNECTIONS

This application is a continuation of application Ser. No. 08/142,251, filed Oct. 22, 1993 entitled "Semiconductor/ Device Assembly With Minimized Bond Finger Connections," by Ivor Barber, now abandoned.

FIELD OF THE INVENTION

This invention relates generally to semiconductor device assemblies, and in particular, to electrical connection of semiconductor dies.

BACKGROUND OF THE INVENTION

Semiconductor Dies; In General

Improved methods for miniaturization of semiconductor devices have permitted the integration of millions of transistor circuit elements onto a single silicone embodiment thereof. Such a circuit is typically referred to as an integrated circuit chip or semiconductor die.

Semiconductor dies are created from a silicon wafer through the employment of various etching, doping and depositing steps that are well known in the art. Ultimately, the semiconductor die may be packaged by encapsulating the semiconductor die to form an "integrated circuit package" having a variety of pin-out or mounting and interconnection schemes. More sophisticated integrated circuit packages have been developed for very large scale integration ("VLSI") semiconductor dies. Such integrated circuit packages can accommodate the increased number of external connections required with an electronic system.

PGA and BGA Packaging

VLSI integrated circuit packages having high connection capacity are, for example, pin grid array ("PGA") and ball grid array ("BGA") type packages. Both PGA and BGA type packages, including adaptations thereof for surface mount and hybrid applications, employ one or more printed wiring boards (hereinafter referred to as "PWBs"). Such PWBs consist of, for example, polyimide, glass reinforced epoxy, ceramics, or other materials known to those skilled in the art of fabricating VLSI integrated circuit packages.

The PGA and BGA type packages differ mainly in that PGA type packages utilize conductive pins that may be either soldered to a system printed circuit board or inserted into a matching socket which is already soldered to the system printed circuit board. In contrast, BGA packages utilize "solder balls" instead of conductive pins. The solder balls of a BGA package reflow to connection points on a system printed circuit board when heated to a certain temperature, thereby electrically connecting the circuitry of the BGA integrated circuit package to external electronic circuitry.

Electrical circuits in a semiconductor die connect to bond fingers formed around the semiconductor die. Specifically, connections are made from bond pads of a semiconductor die to bond finger pads. The bond fingers are further connected, by vias and conductive leads, to either the conductive pins or conductive solder balls of a PGA type package or BGA type package, respectively. The semiconductor die is protected by encapsulation with a plastic or epoxy material. Examples of VLSI integrated circuit packages are more fully illustrated in co-pending U.S. patent Application Ser. No. 07/917,894 entitled "Ball Bump Grid Array Semiconductor Packages" by Michael Rostoker, Chok J. Chia, Mark Schneider, Michael Steidl, Edwin Fulcher and Keith Newman, filed on Jul. 21, 1992, and assigned to LSI Logic Corporation, the disclosure of which is incorporated by reference herein for all purposes.

As used herein, the term "semiconductor device assembly" refers to a semiconductor die, one or more printed wiring boards, and the associated structure with which the semiconductor die is connected, including connections to a socket or system printed circuit board, and internal connections such as bond wiring.

Connections Between Semiconductor Die and Bond Fingers

Semiconductor device assemblies include bond fingers that are typically arranged in a rectangular array surrounding a semiconductor die. Connections to the semiconductor die are ordinarily achieved by bond wires that are adapted to connect the bond pads of a semiconductor die to surrounding bond fingers. The number and arrangement of bond fingers thus determines the size of the rectangular array that is necessary to expose each bond finger for connection thereto. The semiconductor die must fit squarely within the rectangular array formed by the bond fingers in order to minimize the bond wire lengths between the semiconductor die and bond fingers. Thus, the greater the number of bond fingers in a rectangular array, the larger must be the size of the semiconductor die.

Currently known semiconductor device assemblies rely upon bond fingers to satisfy all connections to a semiconductor die. Currently known semiconductor device assemblies utilize bond fingers to provide all connections between a semiconductor and external circuitry. Such connections include power supply connections, such as ground and power source, as well as signal connections. Power supply connections ordinarily utilize approximately 10% of the bond fingers. Thus, the use of bond fingers for power supply connections results in a significant increase in the size of the rectangular array of bond fingers. This requires a semiconductor die of an increased size.

FIGS. 1 and 2 illustrate a prior art printed wiring board 100. Referring to FIG. 1, the top conductive surface 101 of printed wiring board 100 is illustrated. Top conductive surface 101 includes a set of leads as generally indicated by reference numerals 102. Connected to leads 102 are vias (also referred to as "plated through-holes") as generally indicated by reference numerals 104. Vias 104 connect leads 102 to external connection means such as solder balls (not illustrated). On the other end of leads 102 are signal bond fingers which are generally indicated by reference numerals 106. Signal bond fingers 106 are electrically connected to respective bond pads of a semiconductor die (not illustrated) by bond wires for the transmission of signals therebetween. Thus, signals to and from a semiconductor die connect through bond wires through signal bond fingers 106, through leads 102, through vias 104, to external system circuitry.

Top conductive surface 101 provides for power to be supplied to a semiconductor die by connection with bond fingers that are generally indicated by reference numeral 108. Power bond fingers 108 are interleaved with signal bond fingers 106. Power bond fingers 108 are connected to vias 116. Vias 116 provide for connections to a power supply. Thus, power from a power source is provided to a semiconductor die through an external connection means, through vias 116, through power bond fingers 108 through bond wiring, and onto a semiconductor die (by means of bond pads).

A semiconductor die must also be supplied with connections. Top conductive surface 101 includes a ground plane as indicated by reference numeral 110. Ground plane 110 includes ground bond fingers 114 which are interleaved in the same rectangular array as signal bond fingers 106 and power bond fingers 108. Ground plane 110 is connected to ground vias 112 which, in turn, connect ground plane 110 to external ground. Thus, ground is provided to a semiconductor die through an external connection means, through vias 112, through ground bond fingers 114 through bond wiring, and onto a semiconductor die (by means of bond pads).

Vias 112 and 116 connect top conductive surface 101 of printed wiring board 100 to a bottom conductive surface, as illustrated in FIG. 2. External connection means, such as solder balls (of BGA type packages), are connected to respective contact pads. Contact pads are generally indicated by reference numerals 206. Some of the contact pads correspond to a conductive pattern. Bottom conductive surface 201 cot;rains several conductive patterns, namely, ground pattern 202, as well as power patterns 204a–d. Ground pattern 202 is connected to ground plane 110 (and ground bond fingers 114) through vias 112. Contact pads 206g are connected to ground pattern 202 so that solder balls which are connected to contact pads 206g will pass a ground. Similarly, power patterns 204a–d are connected to power bond fingers 108 through vias 116. Contact pads 206p are connected to power patterns 204a–d so that solder balls which are connected to contact pads 206p will pass power between a semiconductor die and external circuitry. Bottom conductive surface 201 also includes contact pads 206s. Contact pads 206s are electrically connected to vias 104 by conductive leads (not illustrated). Vias 104 further connect to signal bond fingers 106 so that solder balls that are connected to contact pads 206s will pass signals between a semiconductor die and external circuitry.

By interleaving signal bond fingers 106 with power bond fingers 108 and ground bond fingers 114, the rectangular array formed by such bond fingers is significantly expanded. This has the undesirable effect of requiring an increase in the size of the semiconductor die which must be in close proximate alignment with signal bond fingers 106, power bond fingers 108 and ground bond fingers 114 in order to minimize the bond wire lengths.

In sum, the prior art of which the applicant is aware fails to disclose the ability to provide for power supply connections, such as a ground and power source other than through the utilization of bond fingers or contacts that are aligned therewith. In doing so, the size of the array formed by the bond fingers of a semiconductor device assembly is significantly increased. A semiconductor die, which is employed in conjunction with such a semiconductor device assembly, must therefore be of a size larger than necessary to conform to the array of bond fingers. What is needed is a semiconductor device assembly having improved semiconductor connections that employ a minimum number of bond fingers.

SUMMARY OF THE INVENTION

Accordingly, it is an object of the present invention to provide a semiconductor device assembly with an improved design for connecting a semiconductor.

Another object of the present invention is to provide a semiconductor device assembly with an improved design for connecting a semiconductor die to power supply connections, such as a ground and one or more power sources of differing voltages.

Yet another object of the present invention is to minimize the number of bond fingers which are employed in a given semiconductor device assembly.

A further object of the present invention is to minimize the size of an array of bond fingers that is utilized in a given semiconductor device assembly.

Still another object of the present invention is to simplify and compress the space required for power and ground distribution systems of a semiconductor device assembly.

Another object of the present invention is to provide an easily reproducible process for the fabrication of a semiconductor device assembly.

Yet, another object of the present invention is to minimize noise in the power and ground distribution systems of a semiconductor device assembly.

The present invention overcomes the deficiencies of the prior art by providing for connections to be made from a semiconductor die to a conductive layer that is centrally disposed on one surface of a printed wiring board. This serves to reduce the required number of bond fingers of a given semiconductor device assembly. The reduction of bond fingers leads to a commensurate reduction in the size of the semiconductor die employed in a given semiconductor device assembly.

The present invention has a conductive layer centrally disposed on one surface of a printed wiring board. This conductive layer may be divided into one or more conductive segments. Each conductive segment may be connected to a different power supply connection, such as a ground or one or more power sources having differing voltages. A semiconductor die is disposed above the conductive layer. The periphery of the conductive layer extends outwardly from the semiconductor die so as to expose the conductive segments for connection thereto. The semiconductor die is directly connected to the one or more conductive segments. Accordingly, the direct connection of the semiconductor die to the one or more conductive segments provides the semiconductor die with power supply connections without having to resort to using the bond fingers of the printed wiring board.

According to an aspect of the present invention, the conductive segments are formed to have a broad surface area, and thus a low impedance at high frequencies. This low impedance in conjunction with capacitive decoupling facilitates reduction of noise in a semiconductor device assembly.

According to another aspect of the present invention, multiple semiconductor dies can be employed with the above described design. That is, each semiconductor die is supplied with a separate set of conductive segments.

In accordance with a preferred embodiment of the present invention, the conductive segments include a conductive plane that is centrally disposed on the top surface of a printed wiring board. The conductive plane is connected to a conductive pattern disposed on the opposite side of the printed wiring board through an array of vias. In turn, the conductive pattern preferably connects to a ground by external connection means such as conductive solder balls or pins. Surrounding the conductive plane, while preferably coexisting on the same plane as the conductive plane, is one or more concentric conductive rings. The conductive rings are also connected to one or more conductive patterns disposed on the bottom surface of the printed wiring board through a corresponding array of vias. In turn, such conductive patterns preferably connect to one or more power sources by external connection means. A pattern of interconnects is formed in the conductive rings and the conductive plane. Bond fingers and their respective pads are formed so as to surround the conductive rings and the pattern of interconnects. Connections may thus be directly established between these interconnects and the bond pads of a semiconductor die so as to provide the semiconductor die with a ground and one or more power sources. All signal connections may then be made to the surrounding bond finger pads as is well known to those skilled in the art of semiconductor device assemblies. Alternatively, the conductive plane may be connected to a power source whereas the conductive rings are connected to ground.

According to one aspect of a preferred embodiment of the present invention, the conductive plane is of a substantially rectangular shape. Such conductive plane can include, however, a series of indentations due to projections from the surrounding one or more conductive rings. This serves to allow the pattern of interconnects to be formed in a continuous pattern that intersects both the conductive plane and the one or more conductive rings. Accordingly, the pattern of interconnects provides a means of connecting a semiconductor die to the one or more conductive rings, as well as to the conductive plane.

The present invention is preferably employed in conjunction with a single printed wiring board. Further, the present invention is preferably employed in Ball Grid Array ("BGA") and Pin Grid Array ("PGA") type packages. Such packages connect the semiconductor device assembly of the present invention to external circuitry through solder balls or pins, respectively. The present invention can also be used in a variety of other integrated circuit packaging types, including those which employ flip chip technologies.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

The foregoing and other objects, aspects and advantages of the present invention will be better understood from the following detailed description of the preferred embodiment of the invention with reference to the accompanying drawings, in which.

DETAILED DESCRIPTION OF THE PREFERRED EMBODIMENT OF THE PRESENT INVENTION

Figure 1:
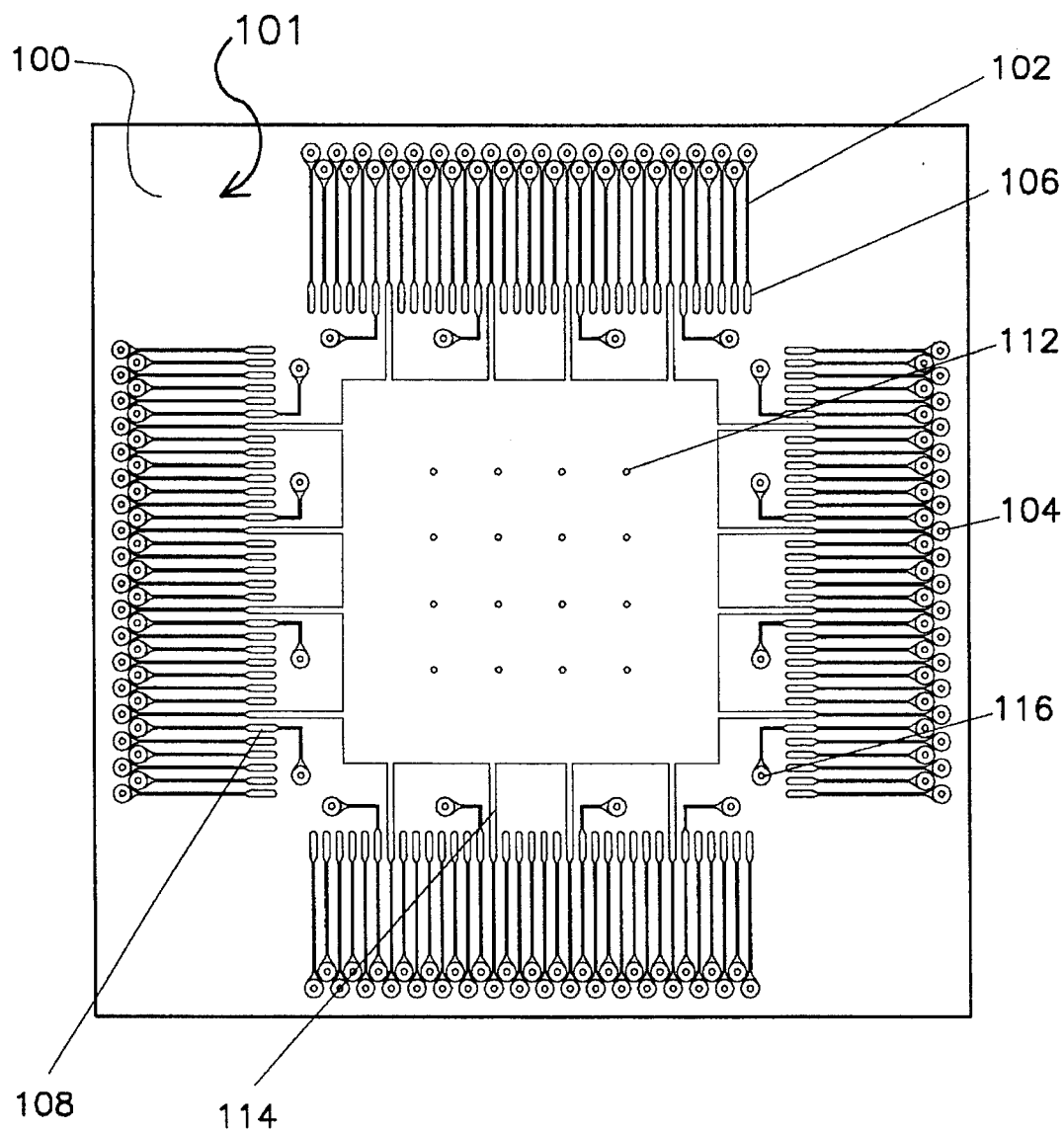
FIG. 1 illustrates the top conductive surface of a printed wiring board, which is known in the prior art.
Figure 2:
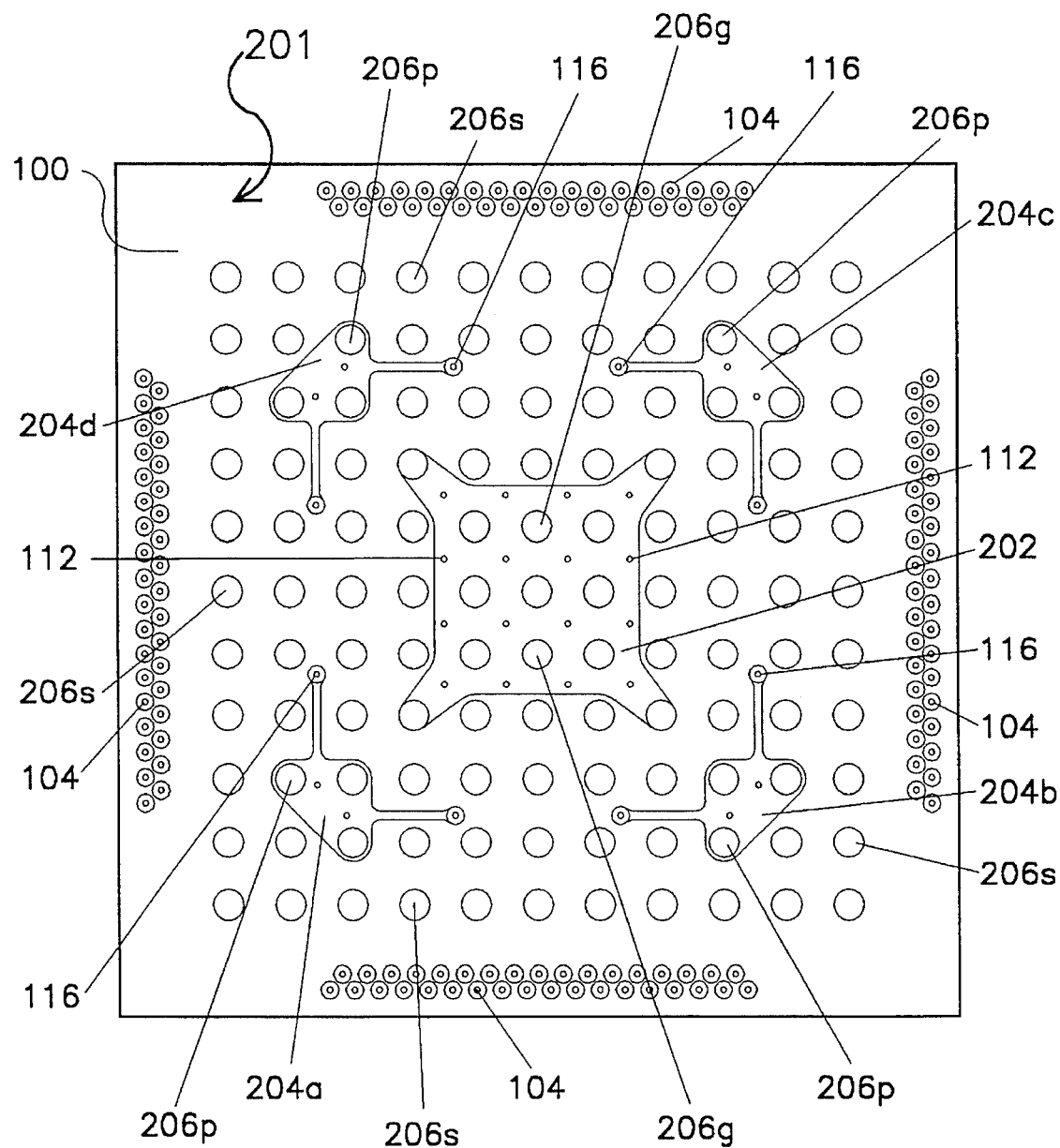
FIG. 2 illustrates the bottom conductive surface of a printed wiring board, which is known in the prior art.

Referring now to the drawings, the details of a preferred embodiment are schematically illustrated. Like elements are generally indicated by the same reference numeral, and similar elements are indicated by the same reference numeral with a different lower case letter suffix.

Conductive Plane and Conductive Ring

Figure 3A:
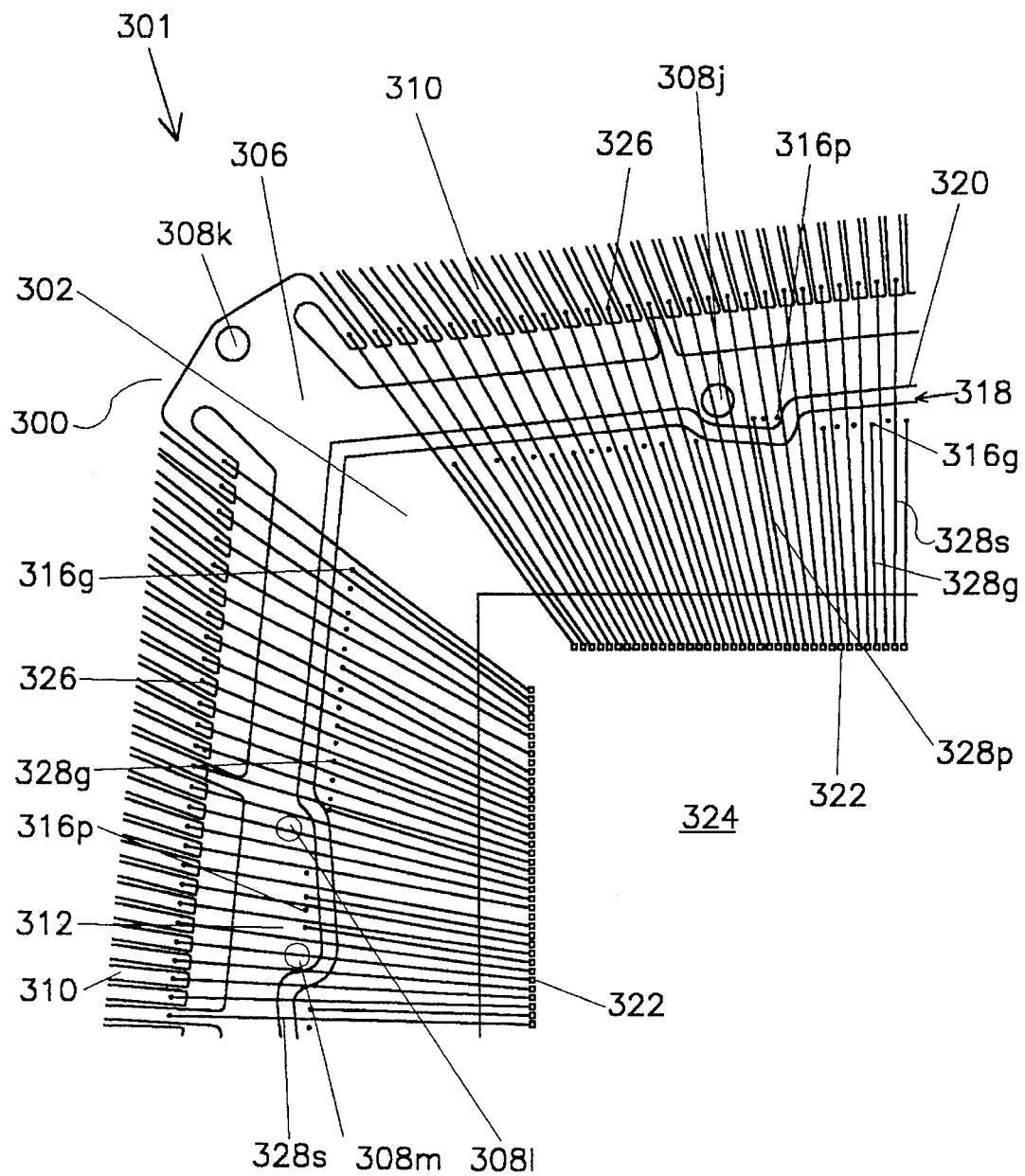
FIG. 3a illustrates an expanded view of the top conductive surface of FIG. 3 when a semiconductor die is disposed above and connected to the top conductive surface, in accordance with a preferred embodiment of the present invention.
Figure 3B:
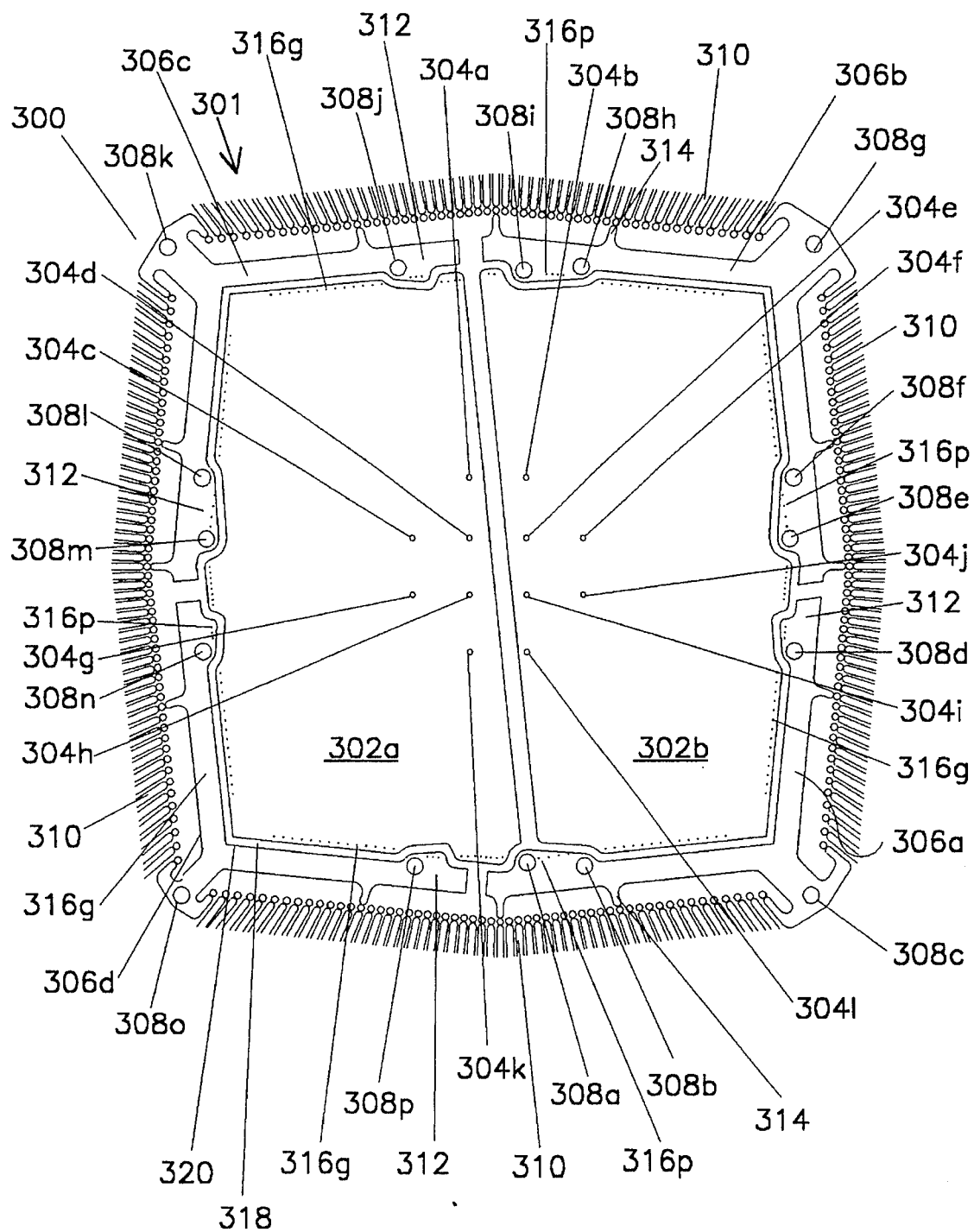
FIG. 3 illustrates the top conductive surface of a printed wiring board, in accordance with a preferred embodiment of the present invention.
Figure 4:
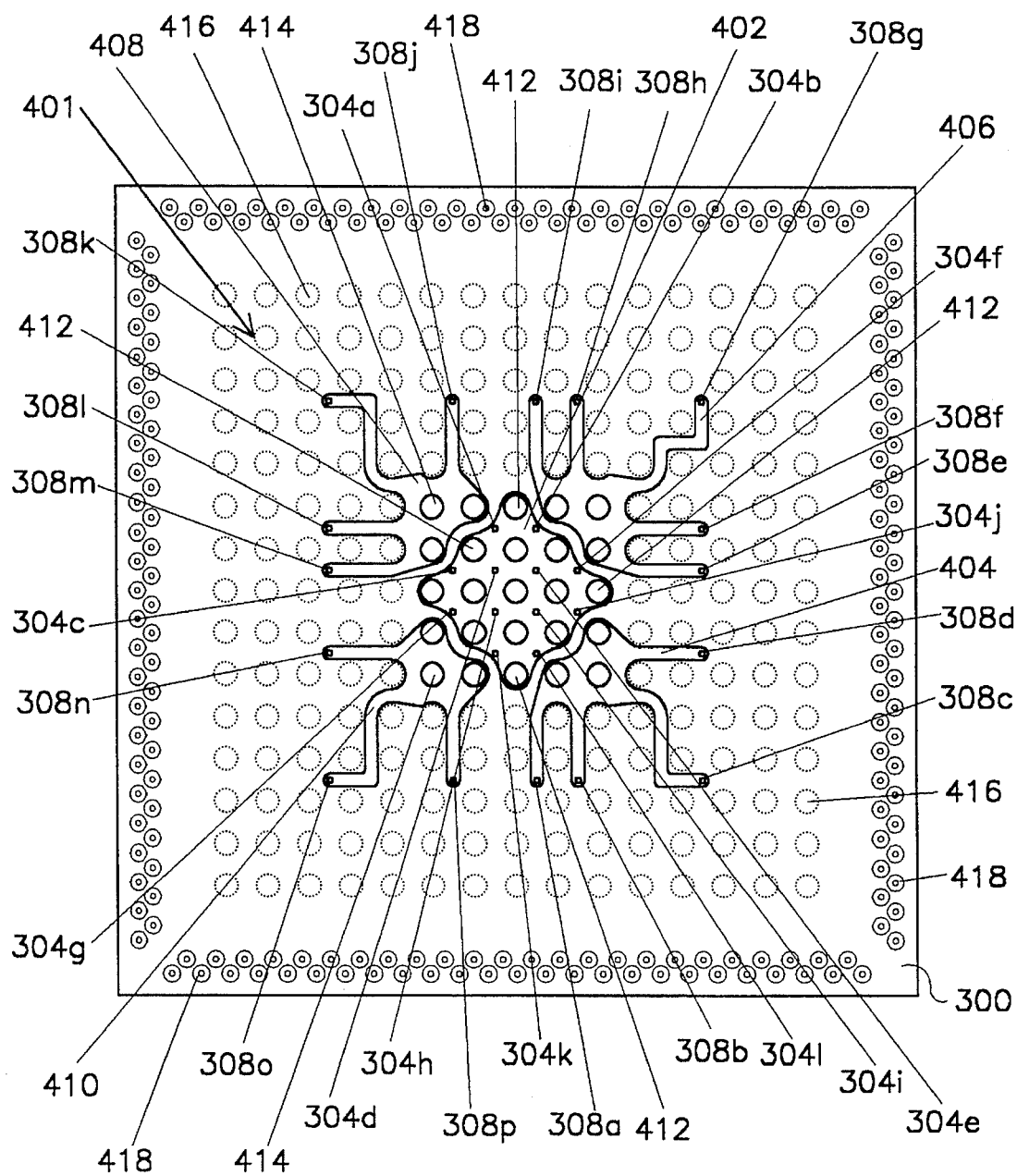
FIG. 4 illustrates the bottom conductive surface corresponding to the top conductive surface of FIGS. 3 and 3a, in accordance with a preferred embodiment of the present invention.

FIGS. 3 and 4 illustrate the top and bottom conductive surfaces, respectively, of a semiconductor device assembly in accordance with a preferred embodiment of the present invention. Such semiconductor device assembly preferably employs a single printed wiring board ("PWB").

Referring to FIG. 3, the top conductive surface of a PWB, in accordance with a preferred embodiment of the present invention, is illustrated. PWB 300 has top conductive surface 301. Top conductive surface 301 of PWB 300 includes a conductive layer that is divided into two segments, namely, a conductive plane and a conductive ring. Such segments are indicated by reference numerals 302, and 306, respectively. Top conductive surface 301 further includes an array of bond fingers as indicated by reference numeral 310. Conductive plane 302 forms the central area of top conductive surface 301. Conductive plane 302 is preferably a metal, such as copper. Conductive plane 302 contains vias (also referred to as "plated through-holes"), as denoted by reference numerals 304a–l. Vias 304a–l provide for connections to solder balls that, in turn, connect to an external connection. Preferably, vias 304a–l connect to solder balls that, in turn, connect to a ground source. Accordingly, conductive plane 302 is operable to provide a ground.

Surrounding conductive plane 302 is conductive ring 306. Conductive ring 306 has an inner perimeter 320 that is separated from the periphery of conductive plane 302 by separation 318. Inner perimeter 320 of conductive ring 306 encroaches, in various locations, upon the substantially rectangular area formed by conductive plane 302. Such encroachments are herein referred to as projections and are indicated by reference numerals 312. Formed within projections 312 are vias 308a–p. Vias 308a–p further connect to various solder balls that, in turn, connect to an external connection. Preferably, vias 308a–p connect to solder balls that, in turn, connect to a power source. Accordingly, conductive ring 306 is operable to provide a voltage from a power source.

Conductive ring 306 preferably spans over a significantly wide area. As such, there is a low inductance; which also correlates to a low impedance. As a consequence, capacitive decoupling of conductive ring 306 and conductive plane 302 results in improved noise reduction. Furthermore, conductive ring 306 is preferably connected to various bond fingers 310 through 314.

Top conductive surface 301 further includes a pattern of interconnects. Interconnects 316g correspond to conductive plane 302, whereas interconnects 316p correspond to conductive ring 306. Projections 312 of conductive ring 306 allow for interconnects 316g and 316p to be placed, in a continuous pattern, so as to connect to both conductive plane 302 and conductive ring 306, respectively. Alternatively, in the absence of projections 312, interconnects 316g and 316p could be formed in a discontinuous pattern which intersects both conductive plane 302 and conductive ring 306.

By being connected to conductive plane 302 and conductive ring 306, interconnects 316g–p can thus provide a semiconductor die with ground and a power source voltages as supplied by conductive plane 302 and conductive ring 306, respectively. This is accomplished by connecting interconnects 316g–p to the bond pads of a semiconductor die (see FIG. 3a). Methods of forming an electrical connection to a semiconductor die, as are well known in the prior art, such as tab automated bonding, may be employed to establish such a connection.

Surrounding interconnects 316g–p is a rectangular array of bond fingers 310. In accordance with the prior art, bond fingers provide a semiconductor die with all signal connections, as well as all power supply connections, to external circuitry (as illustrated in FIG. 1 and discussed above). Therefore, according to the prior art, there must be sufficient bond fingers surrounding the semiconductor die to accommodate all connections required thereto. The same is not true with respect to the present invention. Rather, power supply connections can be made to a semiconductor die through interconnects 316g–p. This serves to reduce the number of bond fingers 310 which, in turn, reduces the size of the rectangular array formed by bond fingers 310. As a consequence, a semiconductor die need only be of minimal size to extend to the inner boundary formed by bond fingers 310.

Referring to FIG. 3a, an expanded view of top conductive surface 301 of PWB 300 when a semiconductor die is disposed thereon and connected to bond fingers 310 and interconnects 316g–p, in accordance with a preferred embodiment of the present invention, is illustrated. A semiconductor die, as indicated by reference numeral 324, is preferably disposed above conductive plane 302. Semiconductor die 324 has bond pads 322 disposed thereon for connection thereto. Bond fingers 310 include pads 326 for connection thereto. Bond wires 328s serve to connect pads 326 of bond fingers 310 to bond pads 322 of semiconductor die 324 for transmitting signals therebetween. Bond wires, as indicated by reference numerals 328g serve to connect interconnects 316g to bond pads 322 of semiconductor die 324 for transmitting a ground therebetween. Similarly, bond wires 328p serve to connect interconnects 316p to bond pads 322 of semiconductor die 324 for transmitting a voltage from a power source therebetween.

PWB 300 is preferably about 0.5 millimeter in thickness. Semiconductor die 324 is preferably about 0.5 millimeter in height. Preferably, bond pads 322 are disposed on the perimeter of the face of semiconductor die 324 for connection thereto, as illustrated in FIG. 3. Bond pads 322 may, however, also be located on the central area of the face of semiconductor die 324, as well as the side of semiconductor die 324, as is well known in the art of integrated circuit design.

Solder balls of a BGA type integrated circuit package establish the connections between a semiconductor die and external circuitry. In other words, solder balls are the points at which the semiconductor device assembly connects to external circuitry. Instead of solder balls, other external connection means may be employed in conjunction with the present invention. Such other external connection means include, among others, conductive pins in accordance with Pin Grid Array ("PGA") type packaging. Solder balls are connected to contact pads of a conductive pattern which are, in turn, connected to a set of vias. The solder balls which are connected to contact pads of a particular conductive pattern thus define what is passed through the vias that are connected to the given conductive pattern.

Referring to FIG. 4, the bottom conductive surface of PWB 300 which includes conductive patterns that correspond to top conductive surface 301 of PWB 300, in accordance with a preferred embodiment of the present invention, is illustrated. Bottom conductive surface 401 includes five conductive patterns, namely, conductive pattern 402, as well as conductive patterns 404, 406, 408, and 410. Contact pads 412 are contained in conductive pattern 402, whereas contact pads 414 are contained within conductive patterns 404–410.

Conductive pattern 402 is connected to conductive plane 302 (see FIG. 3 and 3a) through vias 304a–l. Accordingly, a ground is provided through solder balls that are connected to contact pads 412, through conductive pattern 402, through vias 304a–l, through conductive plane 302, through interconnects 316g, through bond wires 328g, and onto bond pads 322 of semiconductor die 324.

Conductive patterns 404–410 are each connected to conductive ring 306 (see FIG. 3 and 3a) as follows: conductive pattern 404 is connected to conductive ring 306 through vias 308a–d; conductive pattern 406 is connected to conductive ring 306 through vias 308e–i; conductive pattern 408 is connected to conductive ring 306 through vias 308j–m; and conductive pattern 410 is connected to conductive ring 306 through vias 308n–p. Therefore, a voltage from a power source is provided through solder balls that are connected to contact pads 414, through respective conductive patterns 404–410, through vias 308, through conductive ring 306, through interconnects 316p, through bond wires 328p, and onto bond pads 322 of semiconductor die 324.

Bottom conductive surface 401 further includes contact pads that are indicated by reference numerals 416. Contact pads 416 are connected to vias, that are indicated by reference numerals 418, by conductive leads (not illustrated). Vias 418 pass through PWB 300 at its periphery and are further connected to bond fingers 310 of top conductive surface 301 of PWB 300. Accordingly, connections between semiconductor die 324 and external circuitry can be made as follows: through solder balls that are connected to contact pads 416, through bottom side conductive leads, through vias 418 (extending through the PWB 300 at its periphery), through bond fingers 310, through bond wires 328s, and onto bond pads 322 of semiconductor die 324.

Although the above preferred embodiment provides for two conductive segments, namely, conductive plane 302 and conductive ring 306, such segments may be further divided into additional conductive segments. For instance, with reference to FIG. 3b, conductive ring 306 is divided into four segments, as indicated by reference numerals 306a–d, that are respectively connected to conductive patterns 404–410 (as illustrated in FIG. 4). Further, with reference to FIG. 3b, conductive plane 302 is also divided into two segments, as indicated by reference numerals 302a–b. Segments 302a–b can be connected to distinct conductive patterns (that is, conductive pattern 402 of FIG. 4 can be divided into two conductive patterns which correspond to segments 302a–b).

Segments 306a–d and 302a–b can thus provide semiconductor die 324 with a voltage from four distinct power sources.

Conductive Plane and Multiple Conductive Rings

Figure 5:
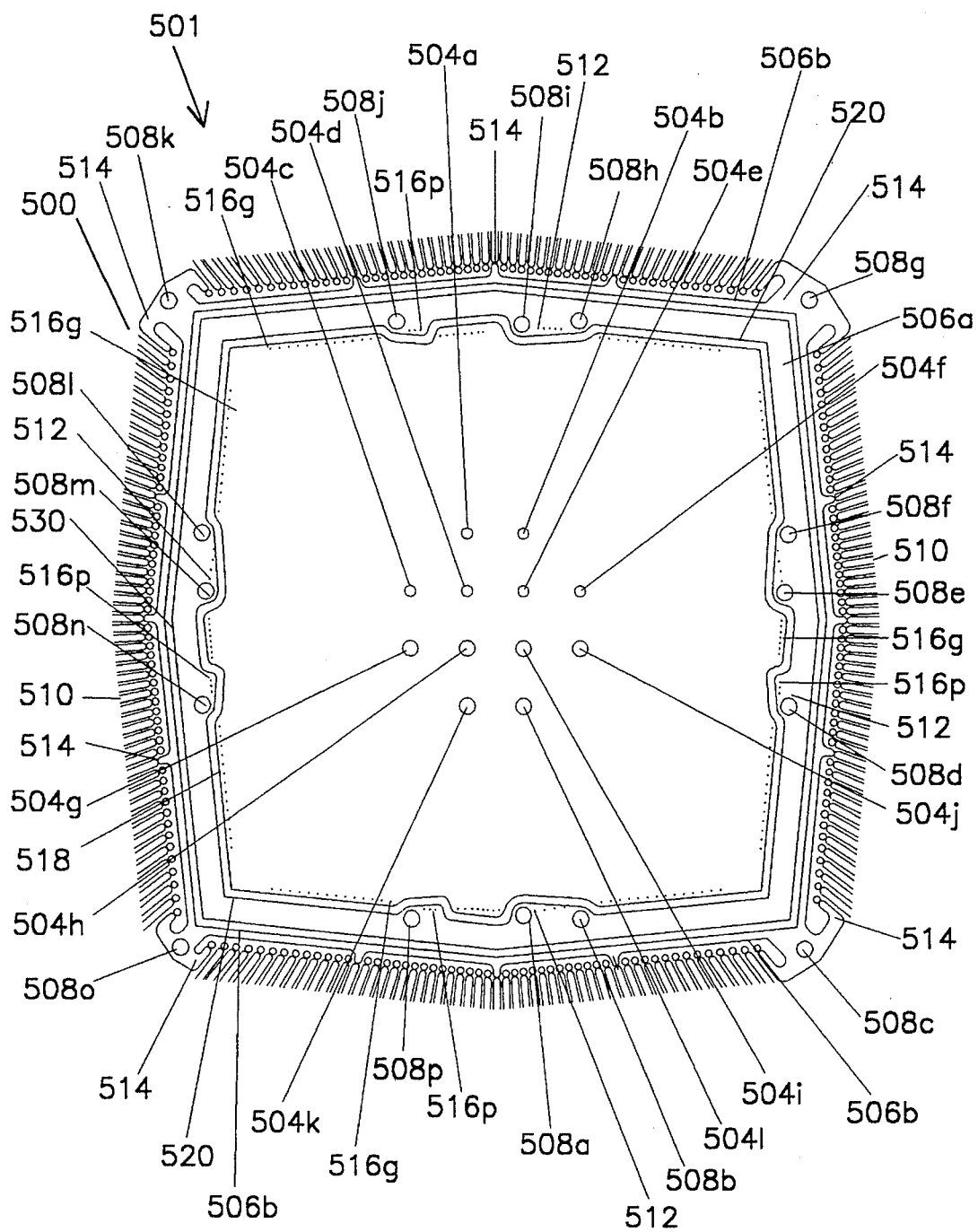
FIG. 5 illustrates the top conductive surface of a printed wiring board, in accordance with another preferred embodiment of the present invention.

In accordance with another preferred embodiment of the present invention, a conductive layer is provided with three conductive segments. Referring to FIG. 5, the top conductive surface of a PWB having three conductive segments for connection thereto, in accordance with another preferred embodiment of the present invention, is illustrated. PWB 500 has a top conductive surface 501. Top conductive surface 501 includes conductive plane, two conductive rings, and an array of bond fingers, as indicated by reference numerals 502, 506a–b and 510, respectively. Forming the central area of top conductive surface 501 is conductive plane 502. Conductive plane 502 is preferably a metal, such as copper. Conductive plane 502 contains vias 504a–l. Vias 504a–l further connect to various solder balls that preferably connect to a ground source. Accordingly, conductive plane 502 is operable to provide a ground.

Top conductive surface 501 further includes conductive rings 506a and 506b. Surrounding conductive plane 502 is conductive ring 506a. Conductive ring 506a has an inner perimeter 520 that is separated from the periphery of conductive plane 502 by separation 518. Inner perimeter 520 of conductive ring 506a encroaches, in various locations, upon the substantially rectangular area formed by conductive plane 502. Such encroachments are herein referred to as projections and are indicated by reference numerals 512. Formed within conductive ring 506a are vias 508a, 508b, 508d, 508e, 508f, 508h, 508i, 508j, 508l, 508m, 508n and 508p. Such vias connect to respective solder balls that preferably provide a voltage from a first power source.

Conductive ring 506a surrounds conductive ring 506b. Conductive rings 506a and 506b are electrically insulated from one another by separation 522. Vias 508c, 508g, 508k and 508o are formed within conductive ring 506b. Such vias connect to respective solder balls that preferably provide a voltage from a second power source. Conductive ring 506b is preferably connected to various bond fingers 510 through 514.

Top conductive surface 501 further includes a pattern of interconnects. Interconnects 516g correspond to conductive ring 502, whereas interconnects 516p correspond to conductive ring 506a. Projections 512 of conductive ring 506a allow for interconnects 516g and 516p to be placed, in a continuous pattern, so as to connect to both conductive ring 502 and conductive ring 506a, respectively. Alternatively, in the absence of projections 512, interconnects 516g and 516g could be formed in a discontinuous pattern which intersects both conductive plane 502 and conductive ring 506a. By being connected to conductive plane 502 and conductive ring 506a, interconnects 516g–p can thus provide a semiconductor die with a ground and voltage from a first power source as supplied to conductive plane 502 and conductive ring 506, respectively. This is accomplished by connecting interconnects 516g–p to the bond pads of a semiconductor die (see FIG. 5a).

Figure 5A:
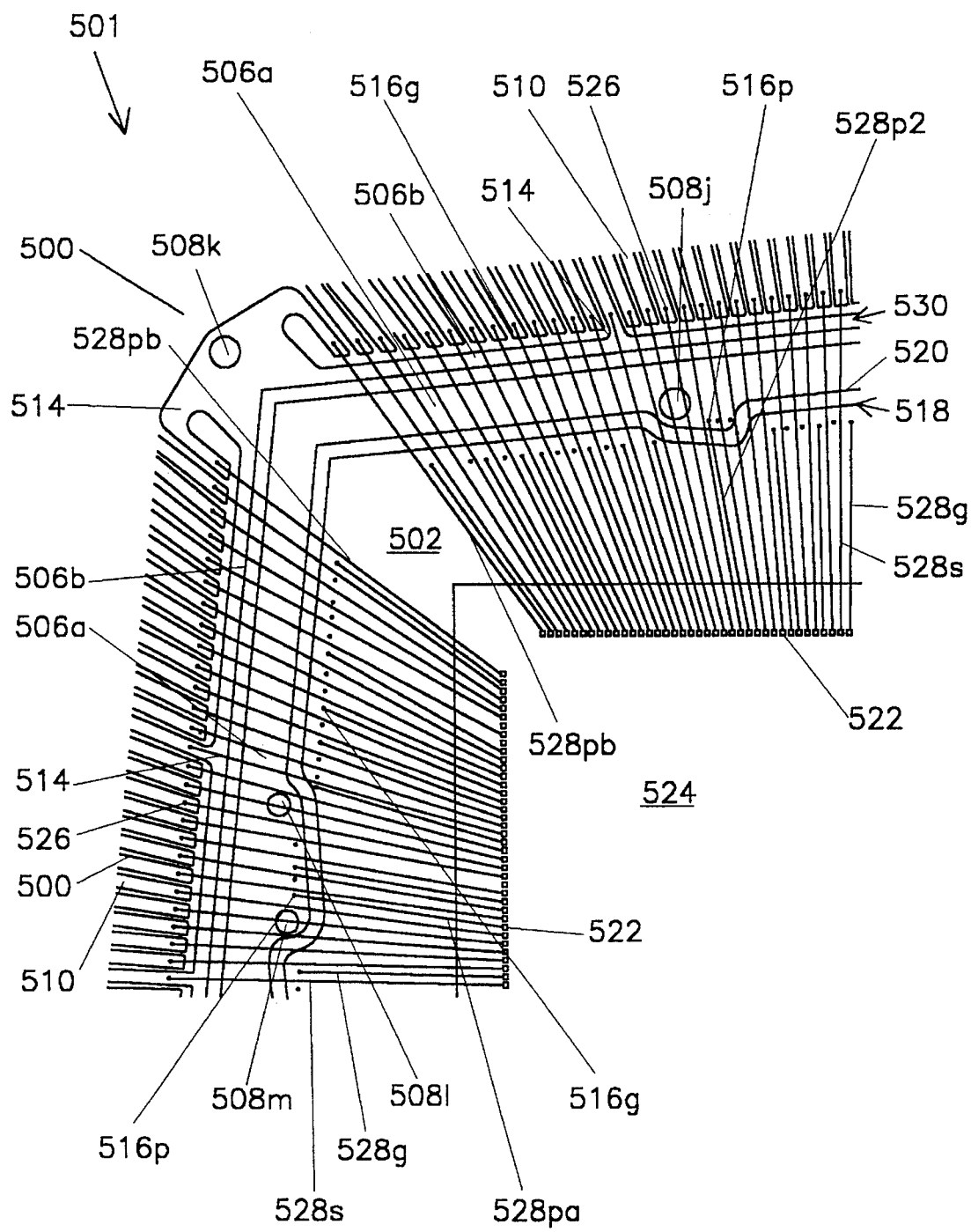
FIG. 5a illustrates an expanded view of the top conductive surface of FIG. 5 when a semiconductor die is disposed above and connected to the top conductive surface, in accordance with another preferred embodiment of the present invention.

Referring to FIG. 5a, an expanded view of top conductive surface 501 of PWB 500 when a semiconductor die is disposed thereon and connected to bond fingers 510 and interconnects 516g–p, is illustrated. A semiconductor die, as indicated by reference numeral 524, is preferably disposed above conductive plane 502. Semiconductor die 524 has bond pads 522 disposed thereon for connection thereto. Bond fingers 510 include pads 526. Bond wires 528s serve to connect pads 526 of bond fingers 510 to bond pads 522 of semiconductor die 524 for transmitting signals therebetween. Similarly, bond wires 528pb serve to connect pads 526 of bond fingers 510 which are connected to conductive ring 506b by bonds 514 to bond pads 522 of semiconductor die 524 for transmitting a voltage from a second power source therebetween. Bond wires 528g serve to connect interconnects 516g to bond pads 522 of semiconductor die 524 for transmitting a ground therebetween. Similarly, bond wires 528pa serve to connect interconnects 516p to bond pads 522 of semiconductor die 524 for transmitting a voltage from a first power source therebetween.

The semiconductor device assembly of the present invention, particularly, the semiconductor die and connections thereto, is preferably protected with an encapsulant, such as epoxy.

Although only one semiconductor die is illustrated in the above preferred embodiments, the present invention may be practiced with multiple semiconductor dies. This is accomplished by providing a conductive layer for each semiconductor die. In particular, the present invention is readily adapted to implement "flip chip" technology wherein semiconductor dies are placed on both the top and bottom surfaces of a PWB.

The present invention is thus-well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art, and which are encompassed within the spirit of the invention and the scope of the appended claims.

Having thus described our invention, what is claimed as new and desire to secure by Letters Patent is:

1. A semiconductor device assembly, comprising:
   (a) a primed wiring board substrate;
   (b) a planar conductive layer centrally disposed on one surface of said printed wiring board substrate, said planar conductive layer including one or more coplanar conductive segments electrically insulated from one another, each coplanar conductive segment adapted for connection thereto;
   (c) a plurality of bond fingers substantially surrounding and coplanar with said planar conductive layer, each bond finger adapted for connection thereto; and
   (d) a semiconductor die disposed above said planar conductive layer, said semiconductor die having bond pads thereon, each coplanar conductive segment of said planar conductive layer having portions substantially the same distance from the semiconductor die bond pads, wherein those portions of each of the coplanar conductive segments being connected directly to a respective bond pad with substantially the same length of connection, and one or more of said plurality of bond fingers being connected to other respective bond pads.

2. The semiconductor device assembly as recited in claim 1, wherein at least one of the one or more conductive segments of said planar conductive layer is operable to connect said semiconductor die to a ground.

3. The semiconductor device assembly as recited in claim 1, wherein at least one of the one more conductive segments of said planar conductive layer is operable to connect said semiconductor die to a power source.

4. The semiconductor device assembly as recited in claim 1, wherein said conductive layer is comprised of metal.

5. The semiconductor device assembly as recited in claim 4, wherein the metal is copper.

6. The semiconductor device assembly as recited in claim 1, further comprising an encapsulant disposed above said semiconductor die.

7. A semiconductor device assembly, comprising:
   (a) a printed wiring board substrate having a top and bottom surface;
   (b) contact pads adapted for connection to external circuits, said contact pads disposed on the bottom surface of said printed wiring board substrate;
   (c) a planar conductive layer disposed on the top surface of said printed wiring board substrate, said planar conductive layer including one or more coplanar conductive segments electrically insulated from one another;
   (d) a plurality of vias connecting each coplanar conductive segment of said planar conductive layer to one or more of the contact pads;
   (e) a plurality of bond fingers substantially surrounding and coplanar with said planar conductive layer, each bond finger connected to one or more of the contact pads; and
   (f) a semiconductor die disposed above said planar conductive layer, said semiconductor die having bond pads thereon, each coplanar conductive segment of said planar conductive layer having portions substantially the same distance from the semiconductor die bond pads, wherein those portions of each of the coplanar conductive segments being directly connected to a respective bond pad with substantially the same length of connection, one or more of said plurality of bond fingers each being connected to other respective bond pads.

8. The semiconductor device assembly as recited in claim 7, wherein each conductive segment is interleaved with respect to one another.

9. The semiconductor device assembly as recited in claim 7, further comprising a plurality of conductive patterns disposed on the bottom surface of said printed wiring board substrate, said plurality of conductive patterns being operable to connect said plurality of vias to respective contact pads.

10. A semiconductor device assembly, comprising:
    (a) a printed wiring board substrate having a top and bottom surface;
    (b) a plurality of contact pads disposed on the bottom surface of said printed wiring board substrate;
    (c) at least one planar inner conductive segment centrally disposed on the top surface of said printed wiring board substrate, said at least one inner conductive segment connected to one or more of the contact pads that are disposed opposite said at least one inner conductive segment;
    (d) one or more coplanar outer conductive segments disposed on the top surface of said printed wiring board substrate and substantially surrounding said one or more inner conductive segments, said one or more outer conductive segments connected to one or more of the contact pads disposed opposite said one or more coplanar outer conductive segments;
    (e) a plurality of bond fingers disposed on the top surface of said printed wiring board substrate and substantially surrounding and coplanar with said one or more outer conductive segments, said plurality of bond fingers connected to one or more of the contact pads; and
    (f) a semiconductor die disposed above said one or more inner conductive segments, said semiconductor die having bond pads thereon, each coplanar inner and outer conductive segment having portions substantially the same distance from the semiconductor die bond pads, wherein those portions of each of the coplanar conductive segments being directly connected to a respective bond pad with substantially the same length of connection being directly connected to a bond pad, other bond pads each being directly connected to one of said plurality of bond fingers.

11. The semiconductor device assembly as recited in claim 10, wherein the at least one inner conductive segment is connected to one or more contact pads that provide a ground connection.

12. The semiconductor device assembly as recited in claim 10, wherein the one or more outer conductive segments are concentric rings.

13. The semiconductor device assembly as recited in claim 12, wherein the concentric rings are connected to one or more contact pads that provide one or more power source connections.

14. The semiconductor device assembly as recited in claim 7, wherein said contact pads are adapted for connection to conductive pins.

15. The semiconductor device assembly as recited in claim 7, wherein said contact pads are adapted for connection to conductive solder balls.

\* \* \* \* \*